United States Patent
Aoki et al.

(10) Patent No.: US 6,372,573 B2
(45) Date of Patent: *Apr. 16, 2002

(54) SELF-ALIGNED TRENCH CAPACITOR CAPPING PROCESS FOR HIGH DENSITY DRAM CELLS

(75) Inventors: Masami Aoki; Hirofumi Inoue, both of Fishkill, NY (US); Bruce W. Porth, Jericho; Max G. Levy, Essex Junction, both of VT (US); Victor R. Nastasi, Hopewell Junction, NY (US); Emily E. Fisch, Burlington; Paul C. Buschner, Colchester, both of VT (US)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/426,754

(22) Filed: Oct. 26, 1999

(51) Int. Cl.[7] .......................................... H01L 21/8242
(52) U.S. Cl. ................. 438/248; 438/243; 438/244; 438/245; 438/246; 438/247; 438/386; 438/387; 438/388; 438/389; 438/390; 438/391; 438/392; 438/249

(58) Field of Search ................................ 438/243–249, 438/386–392

(56) References Cited

U.S. PATENT DOCUMENTS

| | | | |
|---|---|---|---|
| 4,916,524 A | | 4/1990 | Teng et al. |
| 4,927,779 A | | 5/1990 | Dhong et al. |
| 5,014,099 A | | 5/1991 | McElroy |
| 5,360,758 A | * | 11/1994 | Bronner et al. ............... 437/52 |
| 5,372,966 A | | 12/1994 | Kohyama |
| 5,466,636 A | * | 11/1995 | Cronin et al. ............... 437/187 |
| 5,563,085 A | | 10/1996 | Kohyama |
| 5,616,961 A | | 4/1997 | Kohyama |
| 5,643,823 A | | 7/1997 | Ho et al. |
| 5,670,805 A | | 9/1997 | Hammerl et al. |
| 6,008,104 A | * | 12/1999 | Schrems ..................... 438/386 |
| 6,074,909 A | * | 6/2000 | Gruening .................... 438/242 |
| 6,143,599 A | * | 11/2000 | Kim et al. .................. 438/243 |

* cited by examiner

Primary Examiner—John F. Niebling
Assistant Examiner—Jennifer M. Kennedy
(74) Attorney, Agent, or Firm—Banner & Witcoff, Ltd.

(57) ABSTRACT

A process for eliminating roughness on a silicon nitride trench liner is disclosed. A capping film on the top of the trench is formed in a self-aligned manner. This capping film prevents short circuits between a storage node and a passing word-line.

14 Claims, 9 Drawing Sheets

SELF-ALIGNED TRENCH CAPACITOR CAPPING PROCESS FOR HIGH DENSITY DRAM CELLS

I. BACKGROUND OF THE INVENTION

A. Technical Field

The invention generally relates to a process for manufacturing memory cells. More particularly, the invention relates to a self-aligned trench capacitor capping process for high density DRAM cells.

B. Background of the Invention

FIG. 1 shows a trench capacitor for use in a 256 Mbit DRAM. The trench capacitor includes substrate 100 with trench 101. Filling trench 101, is polycrystalline silicon 102. Near the top of trench 101 is collar 103. A side of collar 103 is open to diffusion region 114, which is connected to diffusion region 113 forming the drain region of MOS transistor 114. MOS transistor 114 also includes gate 115, gate oxide 105, and source diffusion region 112. Word line 109 connects gate 115 a shallow trench isolation (STI) region 107 isolates trench 101 from other trenches. The top of polycrystalline silicon 102 is bounded by silicon nitride layer 106 to contain the shallow trench isolation 107. The silicon nitride layer 106 is also referred to as an STI liner. Oxide 104 acts as a buffer between polycrystalline silicon 102 and silicon nitride layer 106. On top of shallow trench isolation 107, word line 110 passes by word line 114 without affecting the operation of the capacitor formed in trench 102.

Total STI height may be almost 300 nm (250 nm under surface and 50 nm above the surface).

To create silicon nitride layer 106, the layer is deposited then etched back using conventional process steps (not shown for simplicity). However, when etching back, the difference between the etching rates of silicon 100, oxide 104–105, silicon nitride (STI liner layer) 106, and shallow trench fill 107 result in a non-planar surface for the device during processing. FIG. 1B shows in greater detail the non-planar resultant structure. FIG. 1B is taken along line II of Figure IA. As shown in FIG. 1B, the beginning of the shallow trench isolation region is a recessed polycrystalline silicon trench 201. Lining the sides of trench 201 is oxide 202. Silicon nitride 203 (also referred to as a trench top capping film) is formed on top of oxide 202. Shallow trench isolation fill 204 fills the remaining area bounded by trench liner 203. As described above, processing the wafer after deposition results in a non-planar surface. At least one reason is that the different etching rates of the STI 204, oxide 202, and trench liner 203 result in an edge of trench liner 203 rising above the surrounding recessed material (oxide 202 and STI fill 204). The resulting non-planar surface of the wafer reduces yield as lithographic techniques cannot adequately focus on the surface of the wafer due to its non-planar features. Further, the oxidation layer 104 consumes the top surface of the polycrystalline silicon node 102 of the trench capacitor. It is difficult to control STI edge shape uniformly due to the rising edge of trench liner 203. This shape impacts the threshold voltage of the transistor.

II. SUMMARY OF THE INVENTION

In response to the problems stemming from the conventional capping process described above, an improved process for capping a trench capacitor is disclosed. The capping process of the invention includes deposition of a silicon nitride pad during the formation of the trench capacitor. After deposition of the pad, the pad is patterned to provide access to the underlying trench. The top service is etched to recess the top surface of the trench below the surface of the surrounding top surface of the wafer. Next, the recessed top surface of the trench is deposited with the trench-capping silicon nitride. The side of the trench to be overlaid with a passing word line is subjected to a deep etch to provide for shallow trench isolation. The exposed surface of the trench is subjected to oxidation to form a buffer and the remaining cavity is filled with STI fill. The surface of the wafer is etched back or subjected to chemical-mechanical polishing to planarize the surface of the wafer. The silicon nitride pad is then removed to expose the surface of the wafer. Finally, a gate oxide is grown or deposited and a gate electrode formed.

In an alternative embodiment of the invention, the surface of the trench may be oxidized prior to deposition of the trench cap. This oxidation provides a buffer between the silicon nitride trench cap and the polycrystalline silicon of the trench.

These and other novel advantages, details, embodiments, features and objects of the present invention will be apparent to those skilled in the art from following the detailed description of the invention, the attached claims and accompanying drawings, listed herein, which are useful in explaining the invention.

III. BRIEF DESCRIPTION OF THE DRAWINGS

In the following text and drawings, wherein similar reference numerals denote similar elements throughout the several views thereof, the present invention is explained with reference to illustrative embodiments, in which.

IV. DETAILED DESCRIPTION

The following detailed description of the invention refers to the substrate of a wafer and performing processing steps in the substrate. As used herein, the term substrate is intended to cover the body of the semiconductor wafer and/or any epitaxial growth of silicon, silicon oxide, or deposition of other material thereon. For example, a MOS transistor may be formed in a substrate wherein the substrate may include an epitaxial growth of silicon on top of an original silicon wafer. In general, the term is being used to commonly refer to the wafer and formed structures thereon.

Figure 12:
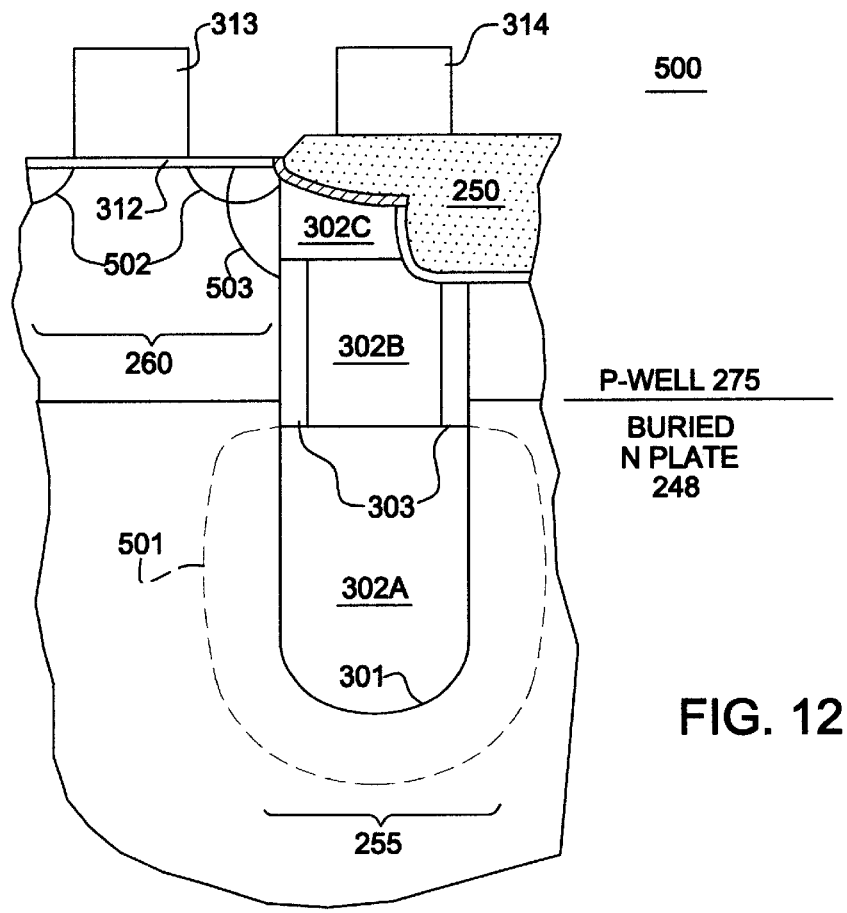
FIG. 12 shows a completed trench capacitor memory cell according to embodiments of the present invention.

As shown in FIG. 12, DRAM cell 500 includes a trench capacitor 255 and a transfer gate 260. Trench capacitor 255 includes a first N$^+$-type polycrystalline silicon fill 302A, a second polycrystalline silicon fill 302B, and a collar oxide 303. Transfer gate 260 includes N-type source/drain and drain/source regions 502 formed in P-type well 275 and a WSi$_x$/polycrystalline silicon gate 313 insulatively spaced from the channel region between source/drain region 502 and drain/source region 502. A shallow trench isolation structure electrically isolates DRAM cell 250 from an adjacent DRAM cell and passing word line 314. Passing word line 314 has a WSi$_x$/polycrystalline silicon structure. A diffusion region 503 electrically connects third polycrystalline silicon fill 302C and drain/source region 502 of MOS transfer gate 260. This diffusion region is formed by out diffusing dopants from the highly doped polycrystalline silicon fill in the storage trench into P-well 275. Diffusion region 503 and third polycrystalline silicon fill 302C constitute a buried strap for connecting trench capacitor 255 to transfer gate 260.

Figure 2A:
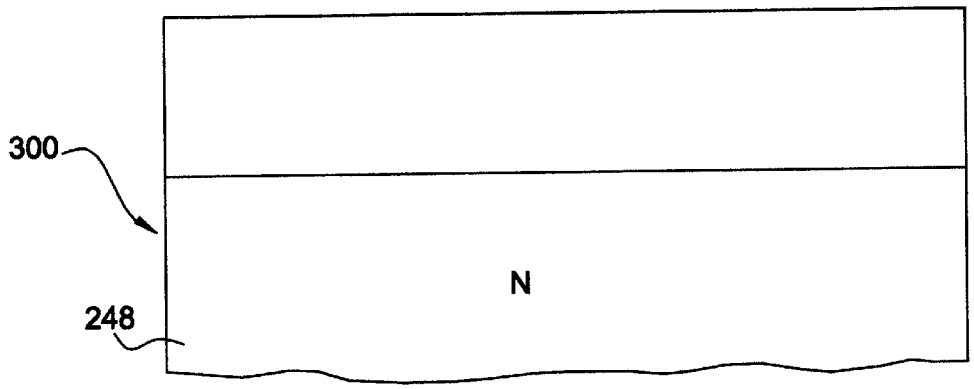
FIGS. 2A–2E illustrate a process for forming a trench capacitor for use with embodiments of the invention.
Figure 2B:
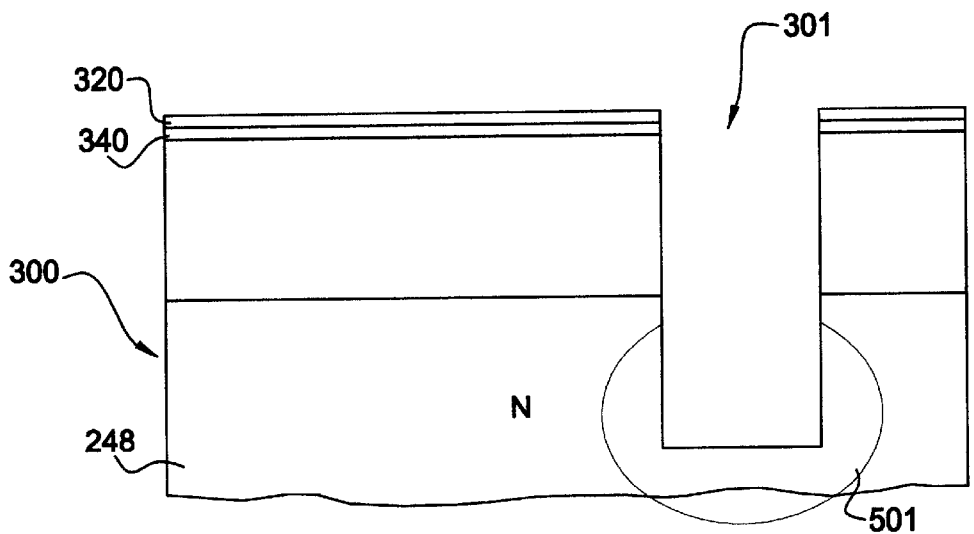
Figure 2C:
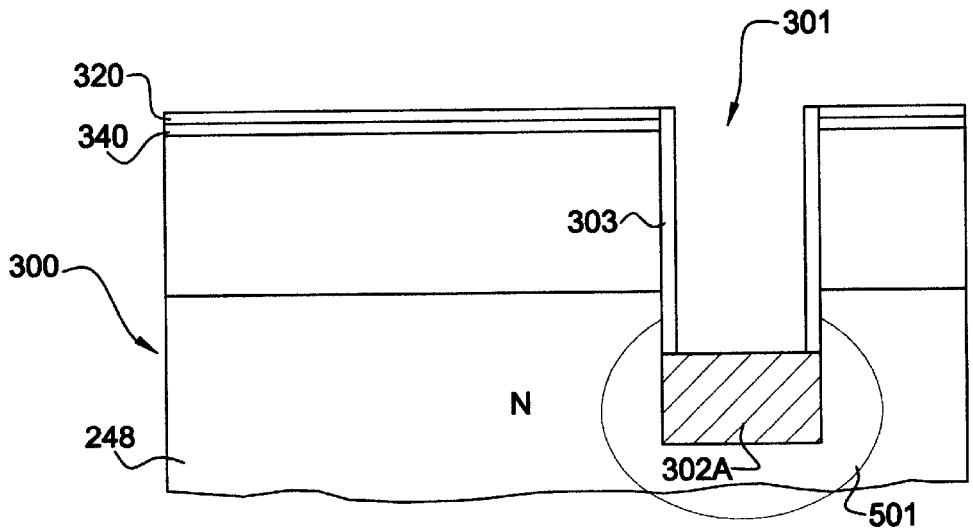

A method of manufacturing the DRAM cell 500 will be described below with reference to FIGS. 2A–2E. As shown in FIG. 2A, buried N-type well 248 is formed in a P-type semiconductor substrate 300 by implanting phosphorous below the intended P-well for a memory cell array. A buried N-type well may also be formed by other methods, e.g., P-well implantation into an N-type semiconductor substrate or by epitaxy. A silicon nitride layer 320 having a thickness of about 0.2 micrometers is formed by chemical vapor deposition, for example, on the surface of a thin oxide layer 304 having a thickness of about 10 nanometers that is thermally grown on semiconductor substrate 300. Oxide layer 304 and silicon nitride layer 320 are patterned and etched to provide a mask for etching a trench 301. Trench 301 is etched using an anisotropic etching process to a depth of about 7 micrometers as shown in FIG. 2B. After storage node trench 301 is etched, an N-type capacitor plate 501 is formed by outdiffusing arsenic from the lower portion of trench 301. This may be accomplished, for example, by depositing an arsenic doped glass layer, etching the arsenic doped glass layer to remain only at the lower portion of trench 301, and performing an annealing process to outdiffuse the arsenic. A storage node dielectric layer (not shown) such as an oxide-nitride (ON) layer or a nitride-oxide (NO) layer is then formed in trench 301. After the dielectric is formed, a first conductive region is formed by filling trench 301 with an impurity-doped first conductive material such as N$^+$-type polycrystalline silicon. The filling step may be carried out using chemical vapor deposition of silane or disilane, for example. The N$^+$-type polycrystalline silicon is then etched back to a first level within trench 301 using an isotropic etch process to form fist trench fill 302A. The level of first trench fill 302A is, for example, about 1.0 micrometer below the surface of semiconductor substrate 300. Collar oxide 303 is then formed on the sidewall of the portion of trench 301 opened by the etching back of the N$^+$-type polycrystalline silicon using low pressure chemical vapor deposition (LPCVD) or plasma-enhanced chemical vapor deposition (PECVD) TEOS as shown in FIG. 2C.

Figure 2D:
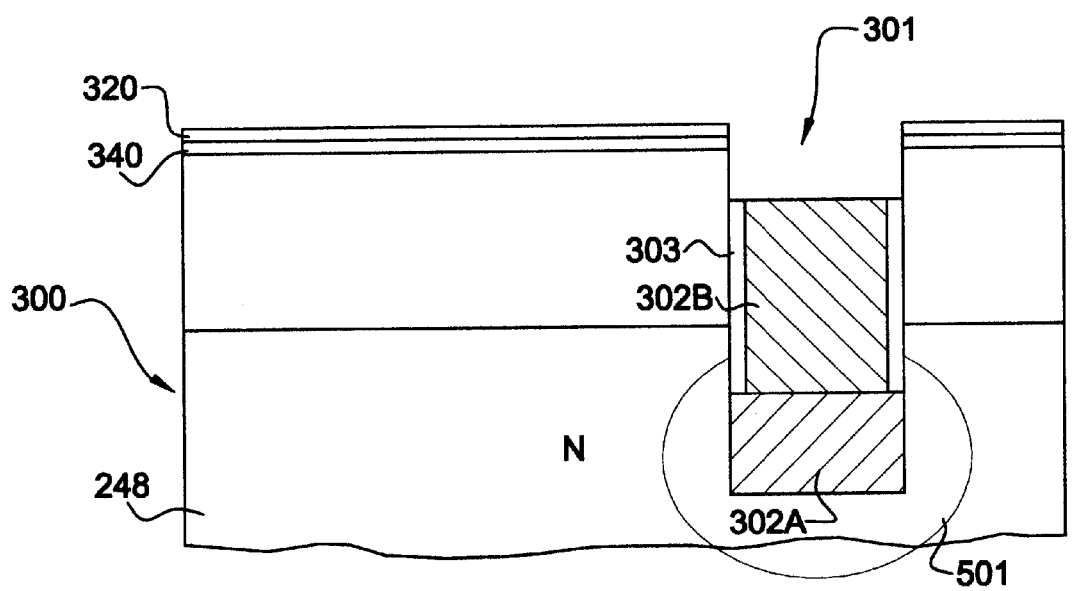
Figure 2E:
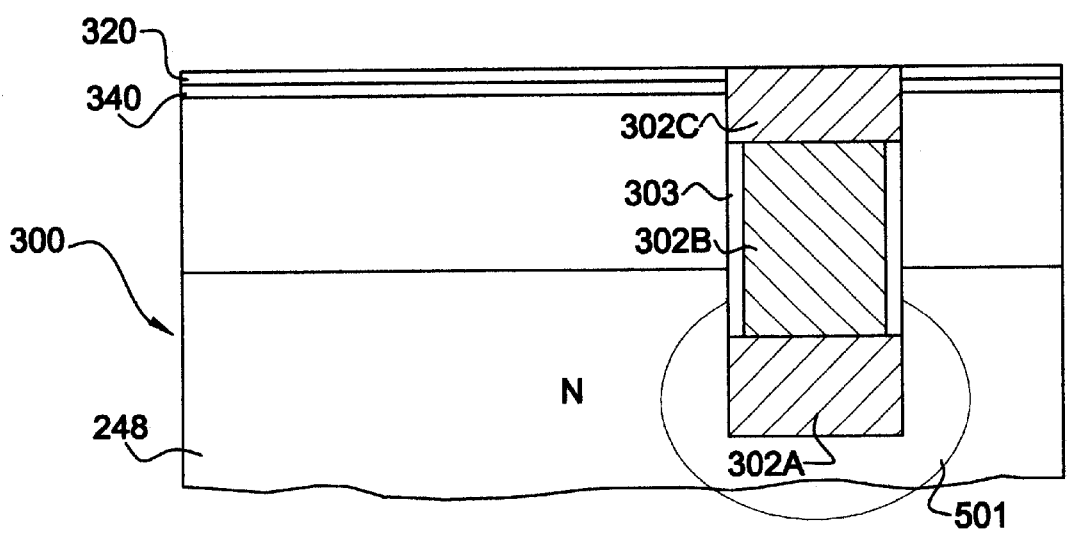

A second conductive region is formed by filling in the remainder of trench 301 with a second conductive material. The second conductive material may be, for example, N$^+$-type polycrystalline silicon or undoped polycrystalline silicon and may be formed by chemical vapor deposition (CVD). The second conductive material and the oxide collar 303 are then etched back to a second level within trench 303 to form second trench fill 302B which is insulated from the semiconductor substrate by collar oxide 303 as shown in FIG. 2D. The depth of the buried strap to be formed in a subsequent process step is defined by this controlled etchback of the second conductive material and collar oxide 303. Second trench fill 302B is etched back to about 0.1 micrometer below the surface of semiconductor substrate 300. An in-situ removal of a native oxide in trench 301 is then performed. In particular, the native oxide on the upper surface of second trench fill 302B and on the sidewall of trench 301 through which impurities for the buried strap will subsequently be outdiffused are removed. This removal of native oxide may be carried out by an in-situ prebake in a hydrogen ambient at a temperature greater than 850° C., for example.

Figure 3:
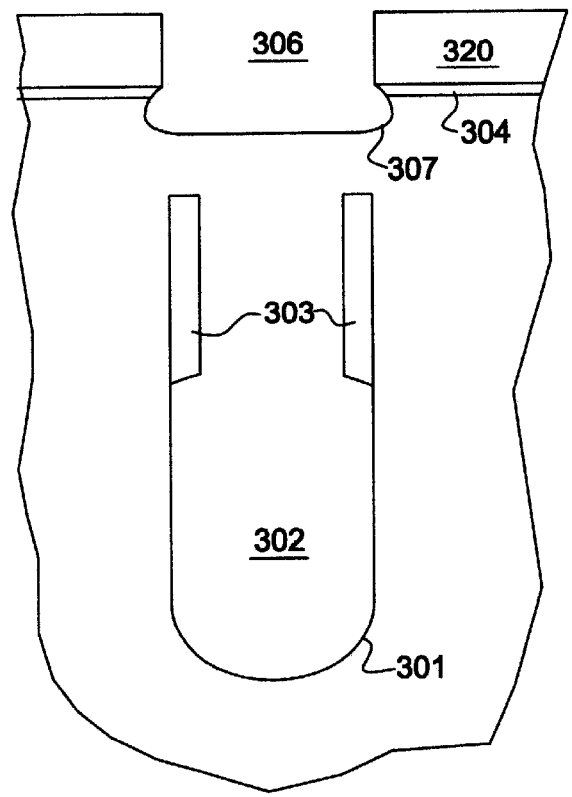
FIGS. 3–9 and 11 show process views of the capping technique according to embodiments of the present invention.
Figure 4:
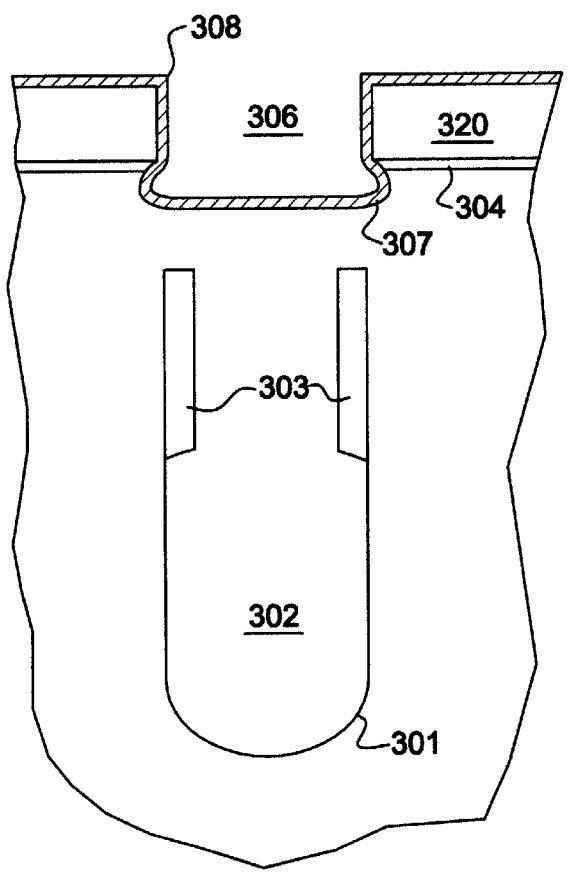

The portion of trench 301 opened by the etching back of collar oxide 303 and the second conductive material is then filled by a third conductive material 302C. The third conductive material may be, for example, undoped polycrystalline silicon deposited by chemical vapor deposition (CVD). FIG. 3 shows a semiconductor substrate 300 with trench 301 formed therein. The trench 301 is filled with polycrystalline silicon 302 A, B, and C (collectively shown as polycrystalline silicon 302). Then poly Si 302C is recessed about 50 nm below the Si surface. This process results in the formation of cavity 307 of FIG. 5. It is noted that any type of etchant may be used. However, an isotropic etchant provides smooth rounded corners and which aids in the deposition of the uniform trench capping layer as shown in FIG. 4 below. An anisotropic etch has some advantages in that it prevents a lateral etch into recess of 302C.

As shown in FIG. 4, trench capping nitride 308 is deposited on pad 320, on the walls of aperture 306, and on the surface of cavity 307. An example silicon nitride deposition technique as is LPCVD at about 700 degrees C or PECVD at about 50 degrees C at a thickness of 5 to 50 nm.

Figure 5:
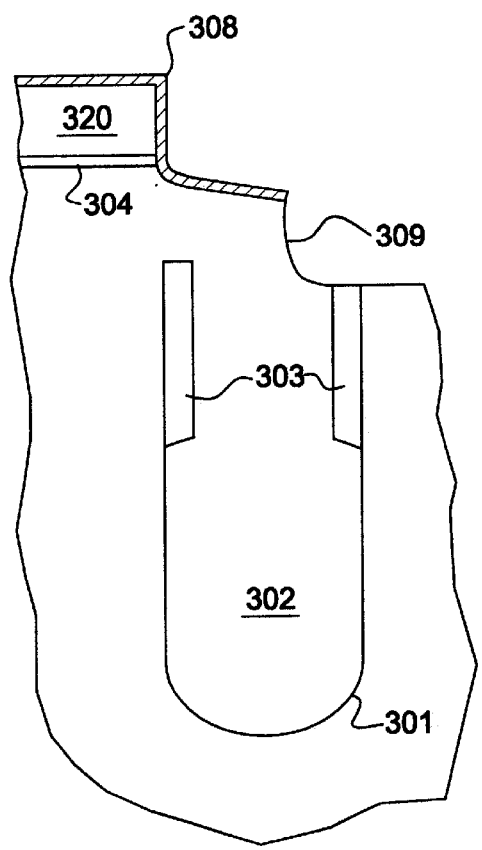

Next, a cavity for the STI fill is formed. Through known lithographic techniques, a resist is deposited, exposed, and unwanted portions removed. Next, the wafer is subjected to an etchant to form cavity 309 as shown in FIG. 5. An example etch time and materials includes NF$_3$ gas for 3 minutes.

Figure 6:
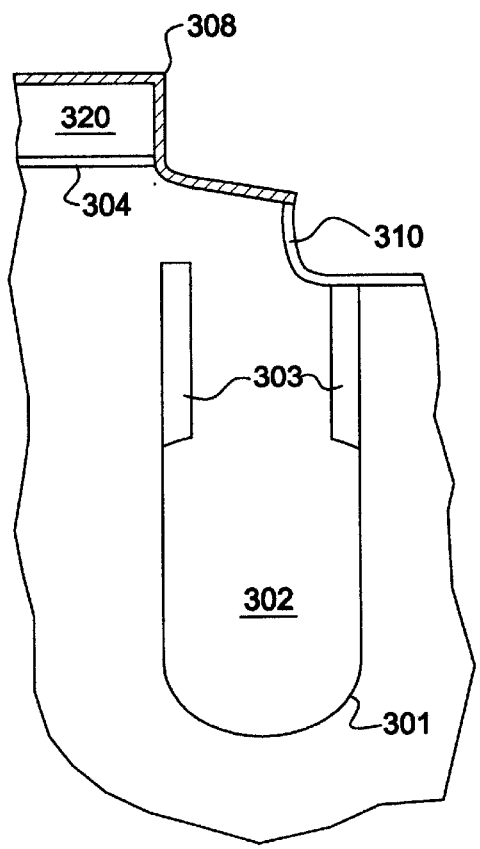

The STI trench cavity isolates the polycrystalline silicon 302 by the STI fill 311. In order to improve isolation, the exposed trench is oxidized to form protective oxide layer 310 as shown in FIG. 6. An example oxidation time is 5 minutes to create a 10 nm layer.

Figure 7:
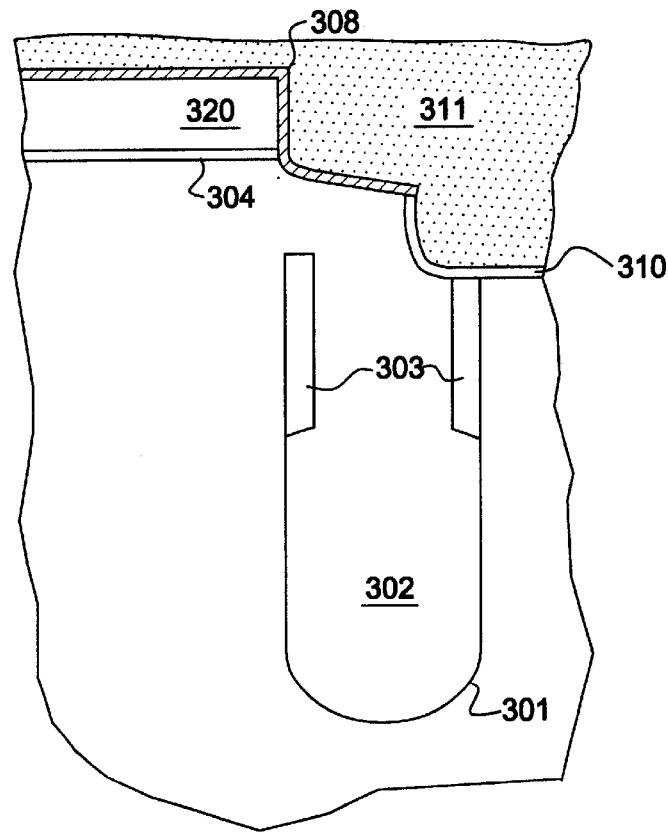
Figure 8:
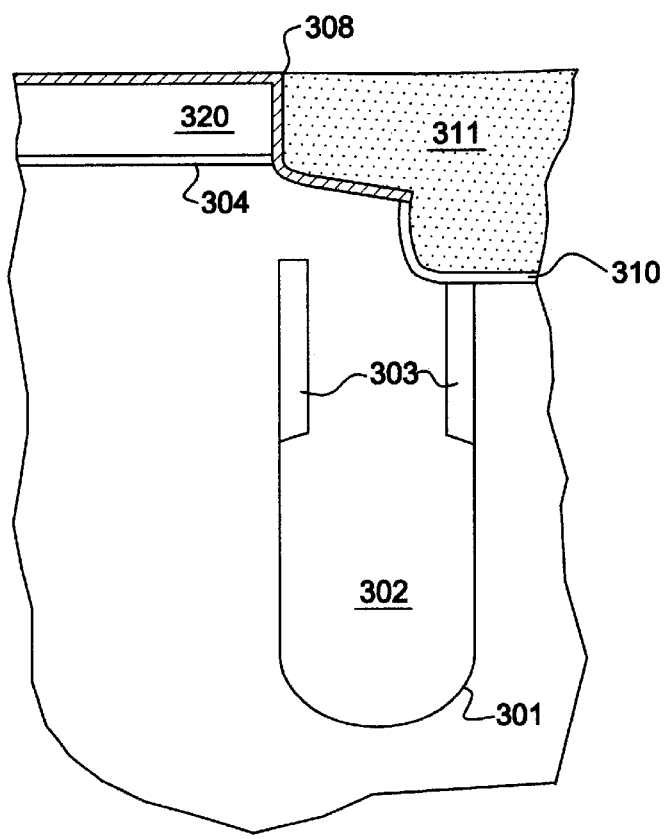

As shown in FIG. 7, the cavity is filled with STI fill 311. Chemical-mechanical polishing of the surface of the wafer may be used. Here the chemical-mechanical polishing planarizes the top surface of the wafer as shown in FIG. 8. A hot phosphoric acid solution applied for 120 seconds may alternatively be used to remove the pad. At this point, oxide layer 304 is damaged. Accordingly, it is removed and regrown through techniques known in the art.

The STI fill 311 has not been etched down to be planar with the oxide 304. This provides a greater separation of passing word lines (313 of FIG. 13 below) and the polycrystalline silicon 302 as the STI fill 311 remains relatively thick.

Figure 9:
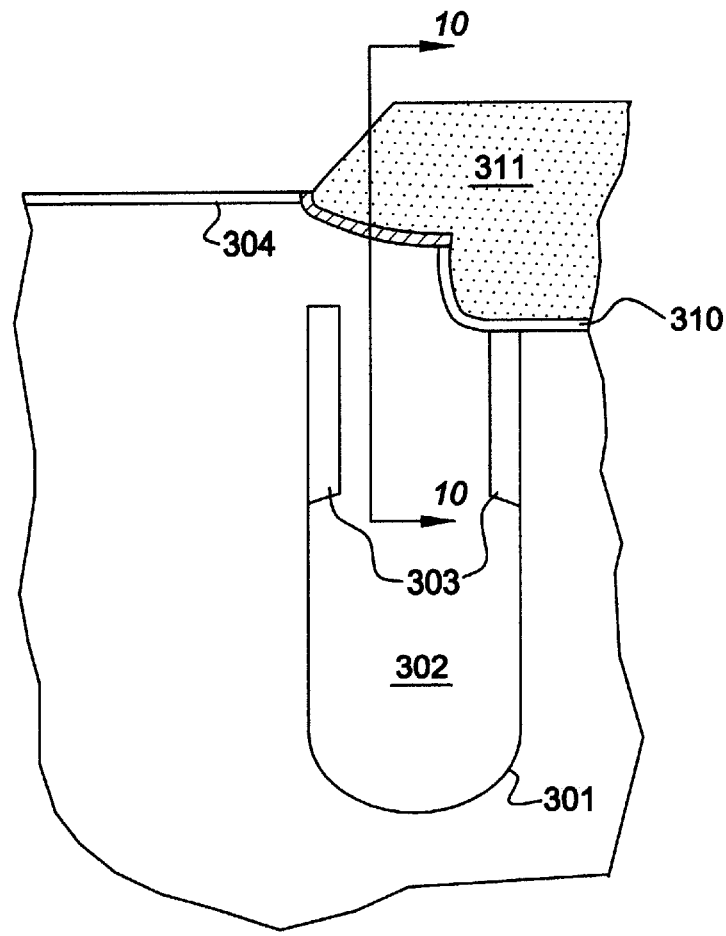
Figure 10:
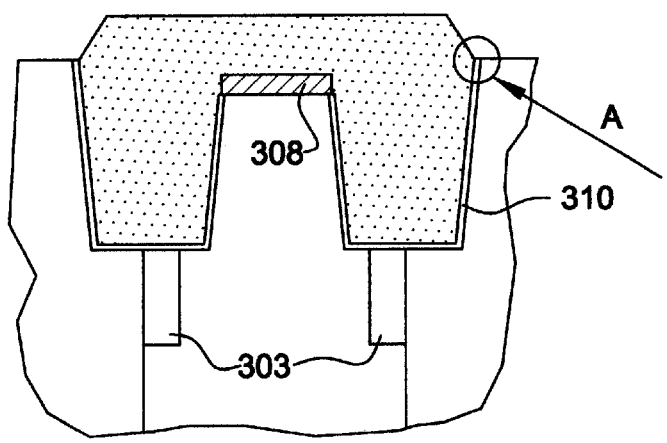
FIG. 10 is a view of the trench capping structure of FIG. 9 from line XII according to embodiments of the present invention.

FIG. 10 shows the planarized result as shown from line XII of FIG. 9. As shown by the circled area highlighted by arrow A, the corner shape of STI edge is smooth without the intruding nitride layer.

Figure 1A:
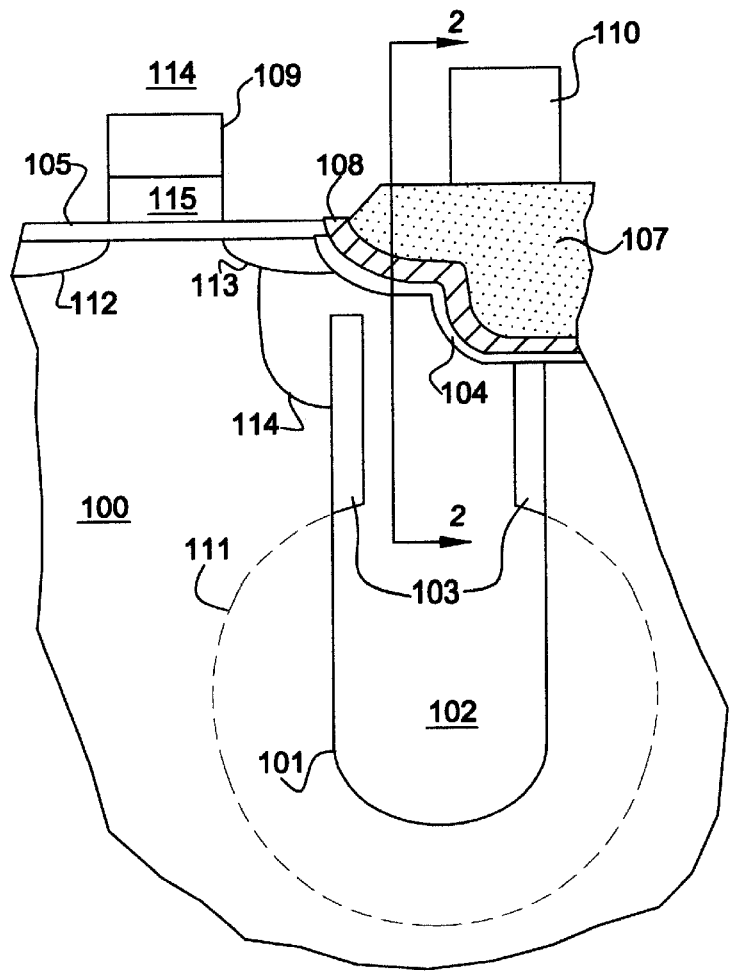
FIGS. 1A and 1B show conventional trench capping structures.
Figure 1B:
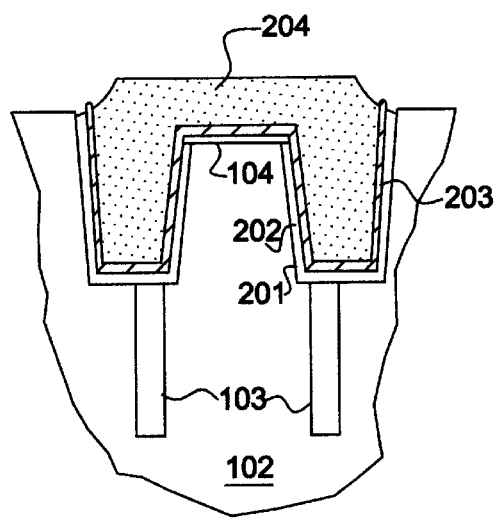
Figure 11:
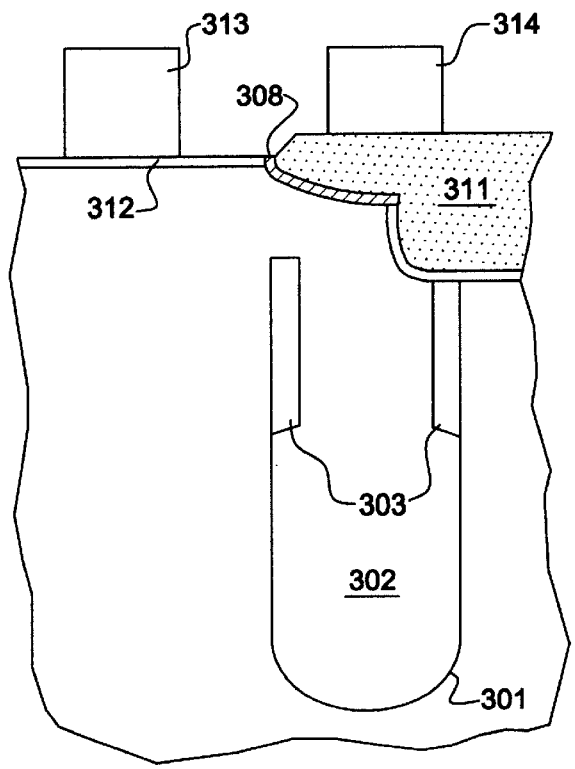

FIG. 11 shows subsequent formation of gate oxide 312 and the deposition of gate electrodes 313 and 314. Here, the end portion of the silicon nitride trench liner 308 has been planarized. This planarized structure eliminates the detrimental non-planar portion as found in FIGS. 1A and 1B. Gate oxide 304 is damaged in the process described above and is, therefore, removed and regrown through known techniques.

Figure 13:
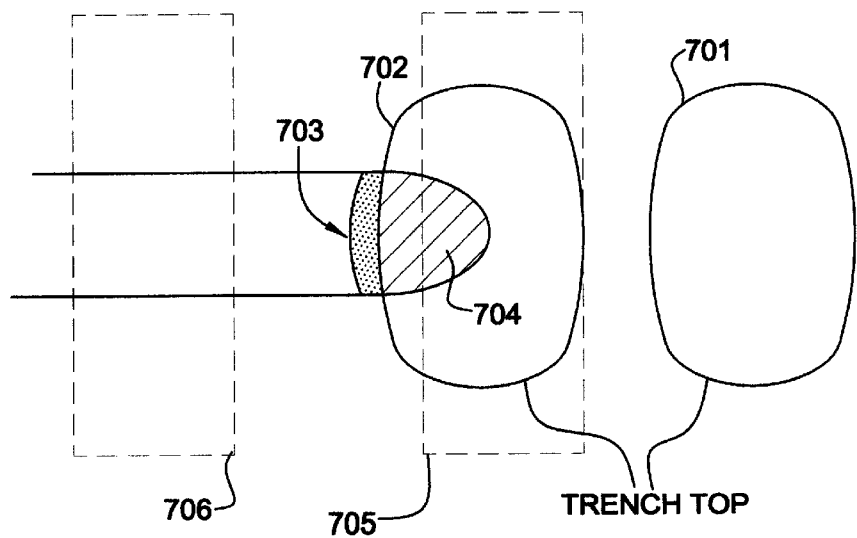
FIG. 13 shows a top down view of a memory cell in accordance with the present invention.

FIG. 13 shows a top view of trenches 701 and 702. Active word line 706 attaches through buried strap 703 to the storage node of the capacitor in trench 702. Trench top capping film is shown by hatched portion 704. Passing word line 705 resides on top of trench 702.

Figures 14, 15:
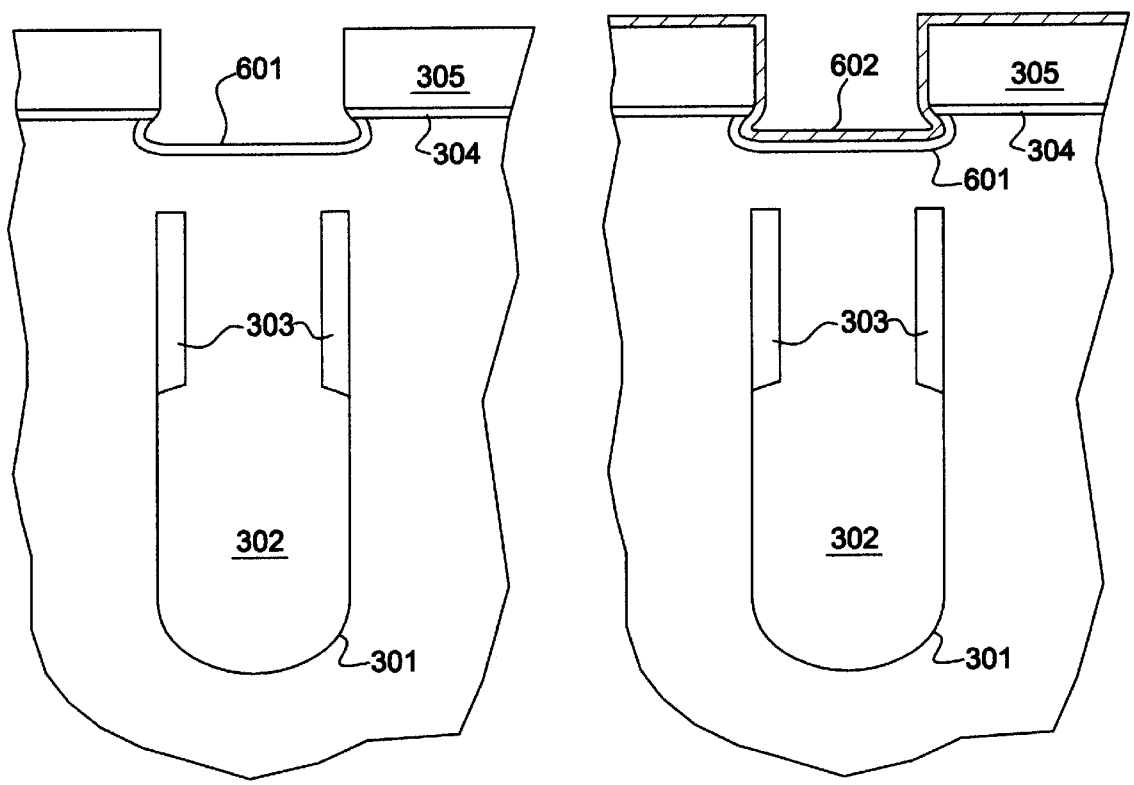
FIGS. 14 and 15 show additional process steps in accordance with alternative embodiments of the present invention.

FIG. 14 shows an alternative embodiment of the invention. In FIG. 14, oxide 601 is grown after the etching step of FIG. 3 to protect the top surface of polycrystalline silicon 302 from degradation. The thickness of oxide 601 may range between 50 to 200 Å.

FIG. 15 shows the deposition of silicon nitride capping layer 602 on oxide 601. Here, the thickness of capping layer 602 may range between 50 and 200 Å. Also, the thickness of the capping layer 602 (as well as 308) may be increased to upwards of 500 Å. Here, this increase in thickness is beneficial because it further isolates the STI fill from the underlying polycrystalline silicon. Also, the opening to the trench will be smaller due to the thicker nitride layer. The smaller opening contributes to good lithography performance in active area patterning because the photo resist coating processing is relatively easier.

Further, the nitride capping layer may be an oxi-nitride layer. This may be deposited via PCVD at 780° C. The use of the oxi-nitride layer leads to greater stress reduction. One advantage of the present invention is that the capping nitride film only exists on the top of the trench, not in the peripheral circuit area.

In the foregoing specification, the present invention has been described with reference to specific exemplary embodiments thereof. Although the invention has been described in terms of a preferred embodiment, those skilled in the art will recognize that various modifications, embodiments or variations of the invention can be practiced within the spirit and scope of the invention as set forth in the appended claims. All are considered within the sphere, spirit, and scope of the invention. The specification and drawings are, therefore, to be regarded in an illustrated rather than restrictive sense. Accordingly, it is not intended that the invention be limited except as may be necessary in view of the appended claims.

We claim:

1. A process for planarizing a trench capping layer used to isolate shallow capacitate trenches comprising:
    etching a surface of a polysilicon layer to recess the surface over a buried trench with a collar;
    depositing a silicon nitride trench capping film on said polysilicon layer and a recessed portion over said buried trench;
    patterning an area above said trench to create a cavity, wherein said cavity is located in a part of the recessed portion;
    oxidizing areas of said trench exposed by said patterning step;
    filling said cavity and said recessed portion;
    removing excess fill;
    removing said silicon nitride trench capping film located on said polysilicon layer, and leaving silicon nitride trench capping film covered with the fill.

2. The process of claim 1, wherein said removing said excess fill step includes chemical etching.

3. The process of claim 1, wherein said removing said excess fill step includes chemical-mechanical polishing.

4. The process of claim 1, including the following steps prior to said etching step:
    depositing a pad through a silicon nitride deposition over said buried trench;
    pattering said pad to open an area over said buried trench.

5. The process of claim 1, further comprising:
    forming an oxide film on said recessed portion prior to depositing said silicon nitride trench capping film.

6. A trench capacitor in a semiconductor memory formed by a process comprising:
    etching a surface of a polysilicon layer to recess the surface over a buried trench with a collar;
    depositing a silicon nitride trench capping film on said polysilicon layer and a recessed portion over said buried trench;
    pattering an area above said buried trench to create a cavity;
    oxidizing areas of said buried trench exposed by said pattering step;
    filling cavity and said recessed portion;
    removing excess fill;
    removing said silicon nitride trench capping film located on said polysilicon layer.

7. The trench capacitor according to claim 6, further comprising the following steps prior to said etching step:
    depositing a pad through a silicon nitride deposition over said buried trench;
    pattering said pad to open an area over said buried trench.

8. The process according to claim 6, further comprising:
    forming an oxide film on said recessed portion prior to depositing said silicon nitride trench capping film.

9. A process for planarizing a trench capping layer used to isolate shallow capacitate trenches comprising:
    forming a buried trench filled with a polysilicon layer in a semiconductor substrate;
    etching a surface of the polysilicon layer to recess the surface over said buried trench with a collar;
    depositing a silicon nitride trench capping film on a recessed portion over said buried trench;
    pattering an area above said buried trench to create a cavity;
    filling said cavity and said recessed portion;
    removing excess fill; and
    removing said silicon nitride trench capping film located on said polysilicon layer.

10. The process according to claim 9, including a step of oxidizing said recessed portion prior to said depositing step of said silicon nitride trench capping film.

11. The process according to claim 9, including a step of oxidizing a surface of said cavity prior to said filling step.

12. The process according to claim 9, further comprising:
    forming an oxide film on said recessed portion prior to depositing said silicon nitride trench capping film.

13. A process for planarizing a trench capping layer used to isolated shallow capacitate trenches comprising:
    forming a pad on a semiconductor substrate;
    forming an opening in said pad;
    forming a buried trench filled with a polysilicon layer in a semiconductor substrate through the opening, said buried trench having a collar;
    etching a surface of the polysilicon layer through the opening to recess the surface over said buried trench;
    depositing a silicon nitride trench capping film on said pad and recessed portion over said buried trench;
    patterning an area above said buried trench to create a cavity;
    filling said cavity and said recessed portion by a dielectric material;
    removing excess fill; and
    removing said pad on said semiconductor substrate and said silicon nitride trench capping film located on said pad.

14. The process according to claim 13, further comprising:
    forming an oxide film on said recessed portion to depositing said silicon nitride trench capping film.

* * * * *

UNITED STATES PATENT AND TRADEMARK OFFICE
CERTIFICATE OF CORRECTION

PATENT NO. : 6,372,573 B2
DATED : April 16, 2002
INVENTOR(S) : Masami Aoki et al.

It is certified that error appears in the above-identified patent and that said Letters Patent is hereby corrected as shown below:

Column 5,
Line 44, delete "oxidizing areas of said trench exposed by said patterning step;"
insert -- oxidizing areas of said buried trench exposed by said patterning step; --

Column 6,
Lines 59-60, delete "said recessed portion to depositing said silicon nitride trench capping film."
insert -- said recessed portion prior to depositing said silicon nitride trench capping film. --

Signed and Sealed this

Eighteenth Day of February, 2003

JAMES E. ROGAN
*Director of the United States Patent and Trademark Office*